(12) United States Patent
Ho

(10) Patent No.: US 6,472,722 B1
(45) Date of Patent: Oct. 29, 2002

(54) TERMINATION STRUCTURE FOR HIGH VOLTAGE DEVICES

(75) Inventor: Jih-Shin Ho, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/898,401

(22) Filed: Jul. 3, 2001

(51) Int. Cl.⁷ ............................................... H01L 29/72
(52) U.S. Cl. ..................... 257/630; 257/314; 257/315; 257/723
(58) Field of Search ................................. 257/314, 315, 257/630, 773

(56) References Cited

U.S. PATENT DOCUMENTS 4,766,474 A * 8/1988 Nakagawa et al. ......... 257/314
4,926,243 A * 5/1990 Nakagawa et al. ......... 257/315

* cited by examiner

Primary Examiner—Edward Wojciechowicz
(74) Attorney, Agent, or Firm—Blakely, Sokoloff, Taylor & Zafman, LLP

(57) ABSTRACT

A power device termination structure is disclosed. The structure comprises a primary field plate electrically connect to a main junction, a secondary field plate electrically connect to a field ring which are apart from the main junction, and a floating field plate formed in between the primary field plate and secondary field plate. The primary field plate and secondary field plate are formed on an insulating layer, and the floating field plate is buried in the insulating layer. The endings of the floating field plate are in alignment with the ends of the extension portion of the primary field plate and the secondary field plate. The primary field plate, the secondary field plate and the floating conductive plate, are capacitively coupled each other so that the electrical field crowding problem is lesser.

9 Claims, 6 Drawing Sheets

TERMINATION STRUCTURE FOR HIGH VOLTAGE DEVICES

FIELD OF THE INVENTION

The present invention relates to a semiconductor process, specifically, to a novel termination structure for power MOS devices so as to prevent leakage current.

BACKGROUND OF THE INVENTION

Doubled diffused metal-oxide-semiconductor field effect transistor (DMOSFET), insulated gate bipolar transistor (IGBT), and Schottky diode are important power devices and use extensively as output rectifiers in switching-mode power supplies and in other high-speed power switching applications. For example, the applications include motor drives, switching of communication device, industry automation and electronic automation. The power devices are usually required carrying large forward current, high reverse-biased blocking voltage, such as above 30 volt, and minimizing the reverse-biased leakage current. There are several reports that trench DMOS, trench IGBT and trench Schottky diode are superior to those of with planar structure.

Among the power device, the IGBT is the most commercially devices. Typical trench IGBT power device is illustrated in FIG. 1, a schematic cross-sectional view. In the figure, a substrate is shown which comprises a p type doping semiconductor substrate 10 having an collector electrode 11 on an opposite face thereof and a n+ buffer region 13, an n-drift region 14 sequentially deposed thereon. In addition, n-drift regions 14 having a p-well region 15 deposed thereon. A trench gate structure has a gate oxide layer 16 therein and a bottom deeply formed into n-drift region 14 of the substrate and, an insulting layer 17 is formed to isolate the conductive layer 18 from the emitter electrode 19. The emitter electrode 19 contacts to the n+ regions and p+ regions. Both regions are in the pitch of trench gate structure and on the p-diffused well regions 15. The p-type substrate 10, the n-type buffer 13 and drift regions 14, and p diffused well region 15 collectively form the collector, base and emitter of a vertical p-n-p bipolar transistor.

For power transistors are concerned, the described power device for carrying large current are susceptible to premature breakdown because the p-diffused well region do not form semi-infinite parallel -plane p-n-junction with the drift region. It is required to consider the edge effects to obtain realistic design. Hence a termination structure design in the periphery of the active region is usually at an end of a die so as to prevent voltage breakdown phenomena from premature.

FIG.2A shows a planar diffused termination. In the case, the electric field (indicated by arrows) crowding are expected to occur at the edge of cylindrical junction 30. Hence, the breakdown of planar diffused junction would be occurred at edge rather in the parallel-plane portion. FIG. 2B shows a field ring 31 fabricated simultaneously with a main junction 32 of a power device. In the case, the electric field (indicated by arrows) and depletion field contour 33 are shown. Comparison of electric field crowding of FIG. 2B with 2A, it cab be seen that the electric field crowding responsible for the premature breakdown voltage is substantial reduced by the presence of field ring region 31.

FIG. 3 shows another sort of field plate 42 termination structure. In the figure, a main junction 40 and a field plate 42 formed on an insulating region 41. A depletion layer 45 indicated by a dotted line may be generated in the substrate 35. Similarly to field ring structure, the presence of the field plate 42 may be able to support a breakdown voltage in a range of about 60% of the ideal breakdown voltage of a parallel-plane junction. In the case, if the insulating layer 41 is thick, breakdown will typically occur in region "A", however if the insulating layer 41 is thin then breakdown will typically occur in region "B".

Since a single field plate and a field ring can reduces depletion layer curvature and electric field crowding. It can be expected that several field plate and field rings working in conjunction with each other may raise the breakdown voltage even closer to the parallel plane case. FIG. 4 shows such forging concept application, a termination design with multiple field plates 50 and field rings 60A, 60B, and 60C. In the case, the spacing s1, s2, and s3 between individual floating filed plate 50 and the width w1, w2, w3 of each field rings 60A, 60B and 60C are varied. Both spacing and width are decreased with increasing distance with main junction 55. If the surface space chares are precisely known, the spacing and width can be aptly selected, the depletion boundary 65 is as illustrated in the figure.

Recently, to prevent low breakdown voltage, another approaching is proposed by Seok in the U.S. Pat. No. 5,731,627 issued on Mar. 24, 1998. In the reference, see FIG. 5, the termination structure comprises overlapping floating field plates. They include a primary field plate 76a and a plurality of floating field plates 76b, 76c, 76d which are formed on an electrically insulating region 66 and capacitively coupled together in series between an active region of a power semiconductor device and a floating field ring 72b.

As forgoing several conventional termination structures, though solve the electric field crowding problems at the edge so that the premature breakdown voltage are substantial improved. However, they usually demands long termination length and hence spend much planar area. An object of the present invention thus proposes a novel termination structure. With the new termination structure the bending region of the depletion region are away from the active region without long termination length, and thus save much planar area.

SUMMARY OF THE INVENTION

The present invention discloses a termination structure method for IGBT power devices and a method making the same. A power device termination structure is disclosed. The structure comprises a primary field plate electrically connect to a main junction, a secondary field plate electrically connect to a field ring which are apart from the main junction, and a floating field plate formed in between the primary field plate and secondary field plate. The primary field plate and secondary field plate are formed on an insulating layer, and the floating field plate is buried in the insulating layer. The endings of floating field plate are in alignment with the ends of the extension portion of the primary field plate and the secondary field plate. The primary field plate, the secondary field plate and the floating conductive plate, are capacitively coupled each other so that the electrical field crowding problem is lesser. Since the termination structure requires only a floating field plate in conjunction with a primary field plate and a secondary field plate and hence reduces significantly the termination area.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
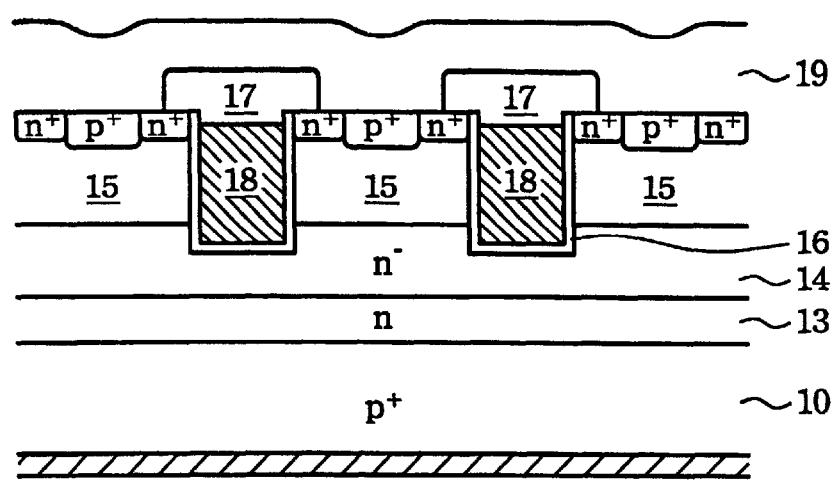
FIG. 1 is a cross-sectional view of semiconductor substrate prepared for IGBT.
Figure 2A:
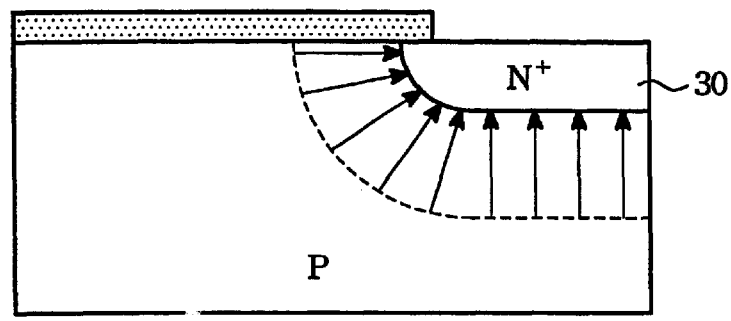
FIG. 2A and FIG. 2B are, respectively, a planar termination structure without and with a floating field ring provided for an electric field crowding comparison.
Figure 2B:
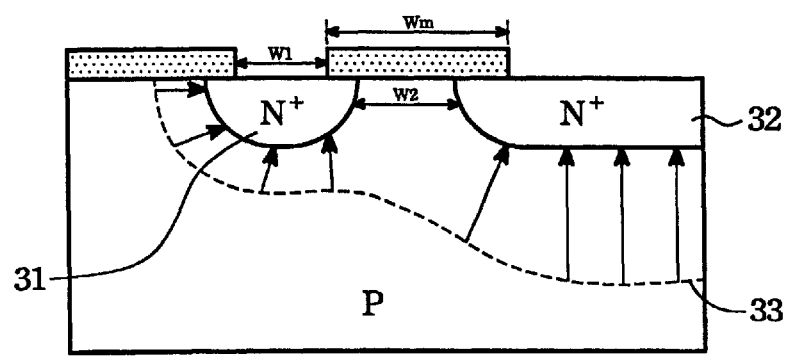
Figure 3:
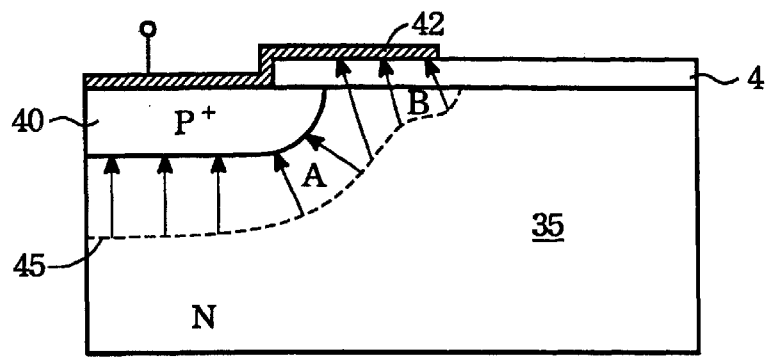
FIG. 3 shows a depletion layer boundary for single floating field plate termination structure in accordance with the prior art.
Figure 4:
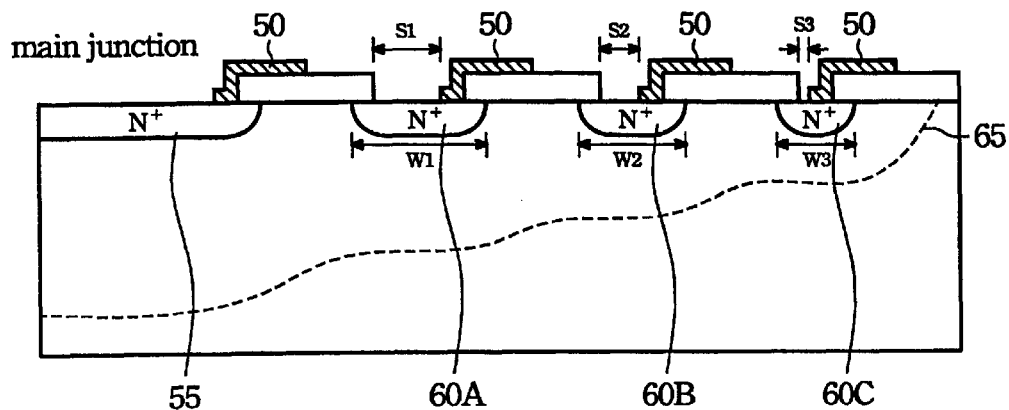
FIG. 4 shows a depletion layer boundary for multiple floating field plate termination structure with gradually decreasing field ring width and spacing in accordance with the prior art.
Figure 5:
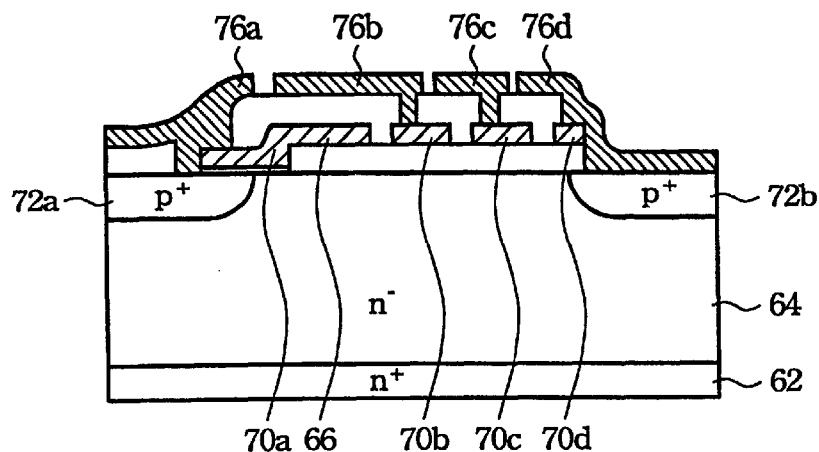
FIG. 5 shows another sort of multiple floating field plate termination structure in accordance with the prior art.
Figure 6A:
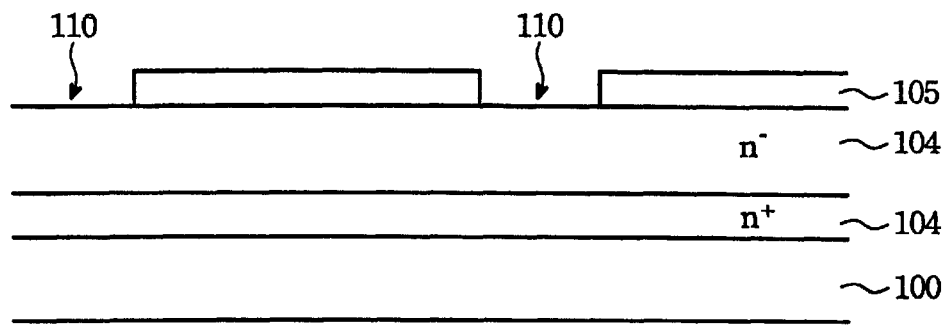
FIG. 6A shows a cross-sectional view of patterning an electrical insulating layer.

Please refer to FIG. 6A, a semiconductor substrate may comprise a buffer layer 102 of first conductivity type (shown as n+) on a semiconductor substrate and a drift region 104 of first conductivity type (shown as N−) thereon. The drift region 104 is best to be an n-type conductive impurity doped epitaxial layer. Thereafter an electrically insulating layer 105 having a thickness between about 1000 nm are formed by depositing or thermally growing a blanket oxide layer (e.g., $SiO_2$) on the face of the drift region 104 of the substrate. Thereafter, to define p-well holes 110 at illustrated regions, an etching process is then performed using a photoresist mask (not shown).

Figure 6B:
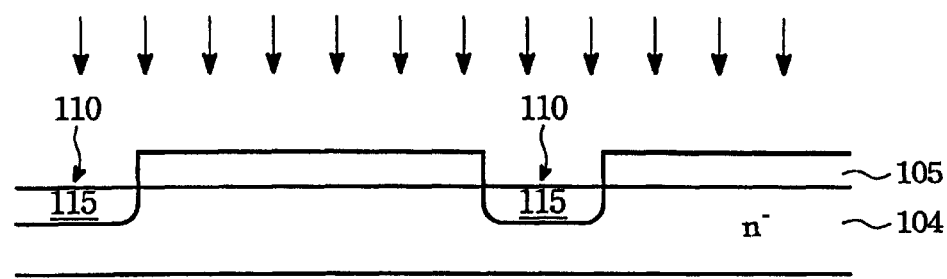
FIG. 6B shows a cross-sectional view of performing ion implantation in accordance with the present invention.

Referring now to FIG. 6B, the portions of the face of the substrate which are exposed after the insulating layer 105 has been patterned are then blanket implanted using a second conductive type impurities such as boron or $BF_2^+$ ions to form doping region 115.

Figure 6C:
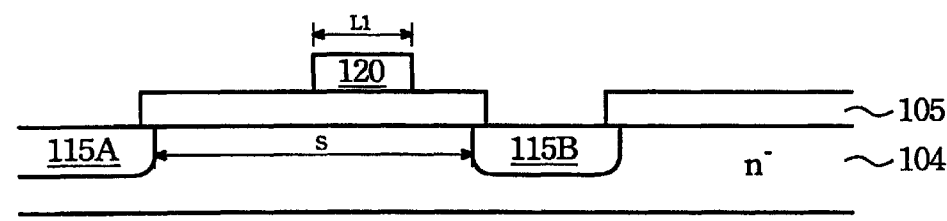
FIG. 6C shows a cross-sectional view of performing annealing process and then forming a floating field plate on the electrical insulating layer in accordance with the present invention.

Referring now to FIG. 6C The p-well regions 115A and 115B are then formed after an anneal process. In the thermal anneal process, the doping region 115 are extended deeply and laterally through the impurities diffusion, as shown. It is noted that the p-well region 115A is a main junction for a power device and the p-well region 115B is a floating field ring for termination structure of the power device. The spacing S between floating field ring 115B and main junction 115A is about 40–60 $\mu$m (typically are 50 $\mu$m). A conductive layer 120 such as polycrystalline silicon (or metal), is then deposited on the insulating layer 105 and exposed surfaces of the drift region 104. The blanket conductive layer is then patterned as a floating field plate 120 using a conventional lithographic and an etching technique. As is shown in the FIG. 6C, the floating field plate 120 is set amid the interval between the main junction 115A and the floating field ring 115B and the length L1 is about 8–12 $\mu$m (typically are 10 $\mu$m).

Figure 6D:
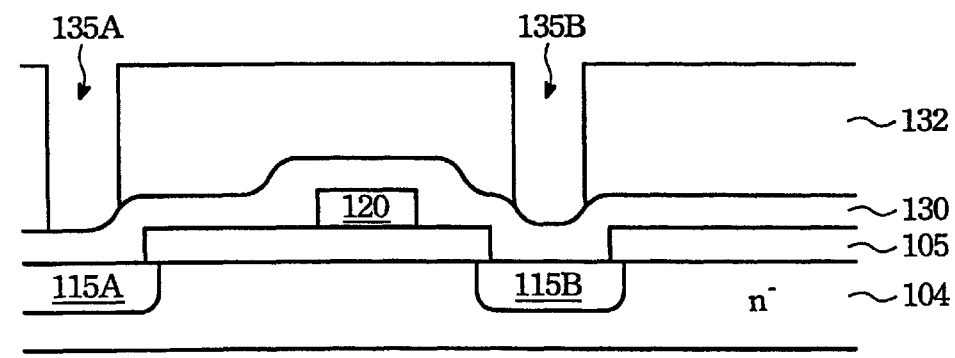
FIG. 6D shows a cross-sectional view of forming a dielectric layer on entire exposed surfaces and then defining contact holes in accordance with the present invention.

Referring to FIG. 6D, a blanket dielectric layer 130 (e.g., $SiO_2$, TEOS, or BPSG is then deposited on the face of the drift region 104, upper surfaces of the field floating plate 120 and exposed portions of the upper surface of the electrically insulating region 105. Thereafter, a photoresist layer 132 is coated atop blanket dielectric layer 130 and then a conventional lithographic technique is carried out to define contact holes 135A, 135B for electrically connection to p-well regions 115A and 115B, respectively.

Figure 6E:
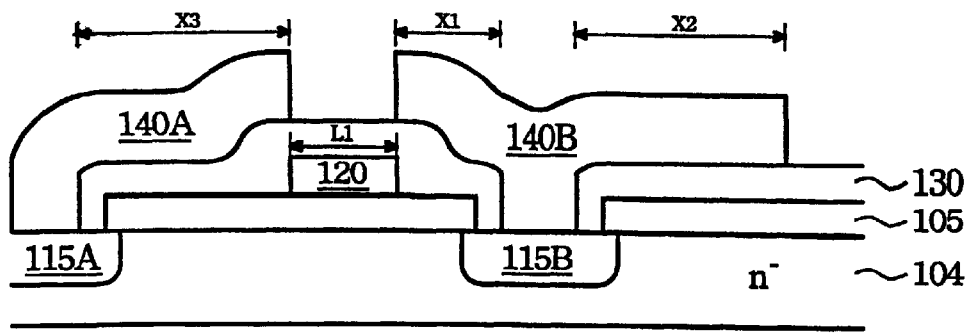
FIG. 6E shows a cross-sectional view of forming a metal layer and refilling the contact holes and then patterning the metal layer to form primary field plate and secondary field plate in accordance with the present invention.

Referring to FIG. 6E, an etching technique is implemented to form contact holes 135A, 135*b* using photoresist pattern 132 as a mask. After striping the photoresist pattern 132, a second conductive layer (such as metal layer) is then deposited on dielectric layer 130 and refilled the contact holes 135A, 135B. Next, the second conductive layer is then patterned to form a primary field plate 140A and a secondary field plat 140B. In patterning process, the extension portion of the primary field plate 140A from the contact hole 135A is toward the floating plate 120. On the other hand, the secondary field plate has a first extension portion toward floating plate 120 and a second extension portion away from the floating plate 120.

In a preferred embodiment, the second extension portion of the secondary field plate 140B has a length X2 which is about the same as the extension portion X3 of the primary field plate 140A (i.e. X2≈X3) but longer than first extension portion X1. For example, X1 is in between (¼) X2 to (⅕)X2. The endings of the first floating conductive plate 120 may have some, respectively, overlap with the extension portion of the primary field plate 140A or overlap with the extension portion of the first secondary field plate. Preferably, however, the endings of the first floating conductive plate 120 are, respectively, aligned with an end of the first extension portion of the primary field plate 140A and an end of the first extension portion of the secondary field plate 140B, as is shownso that they form an electrical capacitivity coupled each other.

Figure 7B:
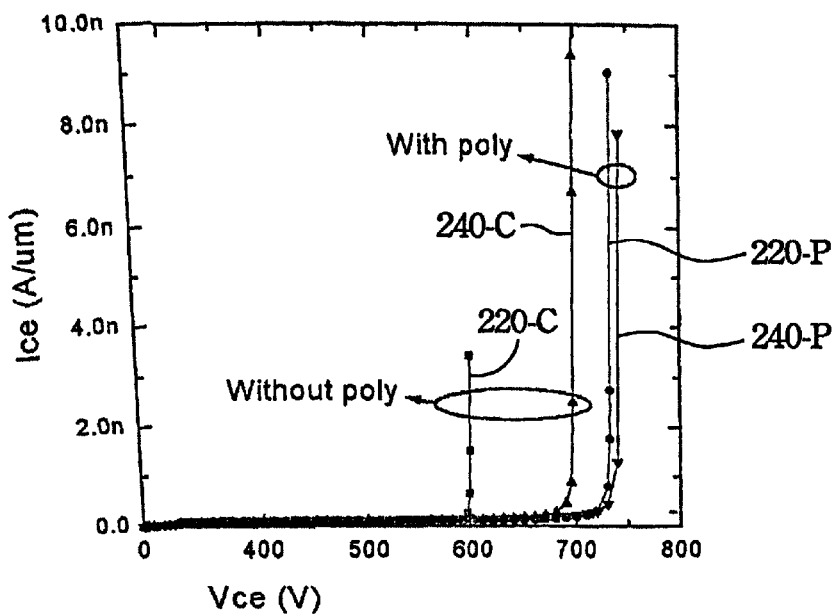
FIG. 7B shows a comparison of the breakdown voltage of the present invention termination structure with conventional's.
Figure 7A:
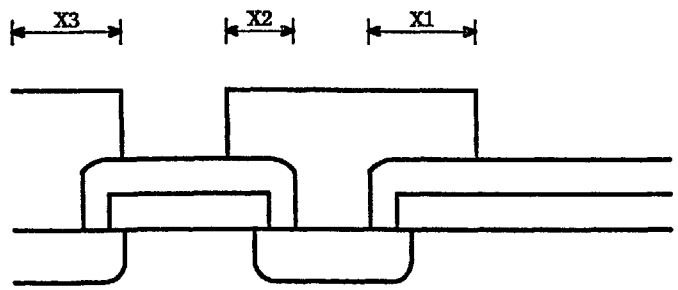
FIG. 7A shows a conventional termination structure having a field ring, primary field plate and secondary but without a floating plate.

For proving the effect of floating conductive plate 120 to the breakdown voltage improvement, a comparison is made. FIG. 7A shows a similar termination structure in accordance with prior art which has a primary field plate, floating ring, and a secondary field plate but without floating conductive plate 120. FIG. 7B shows a diagram of voltage versus current for a termination structure with or without a floating conductive plate 120 when testing voltages are applied to the IGBT power semiconductor device. The conditions for simulation are as follows: the curve 220-C by the conditions of X2=X3=20 $\mu$m, and X1=10 $\mu$m. The curve 220-P by the conditions of X2=X3=20 $\mu$m, X1=10 $\mu$m and has L1=10 $\mu$m of floating field plate 120. The curve 240-C by the conditions of X2=X3=40 µm, and X1=10 µm. The curve 240-P by the conditions of X2=X3=40 µm, X1=10 µm and has L1=10 µm of floating field plate 120. From the results, the breakdown voltage is strongly related with the length of the extension portion of the field plate X2 and X3 for termination structure without float field plate from 600 V (for X2=20 µm) increases to 700V(for X2=40 µm). By contrast, with the floating plate 120 in between primary field plate and secondary field plate, the dependence of the breakdown voltage low is lessen from a value of about 730 V (for X2=20 µm) increases to 740V(for X2=40 µm). The breakdown voltage for termination structure of present invention is prominent.

Figure 7C:
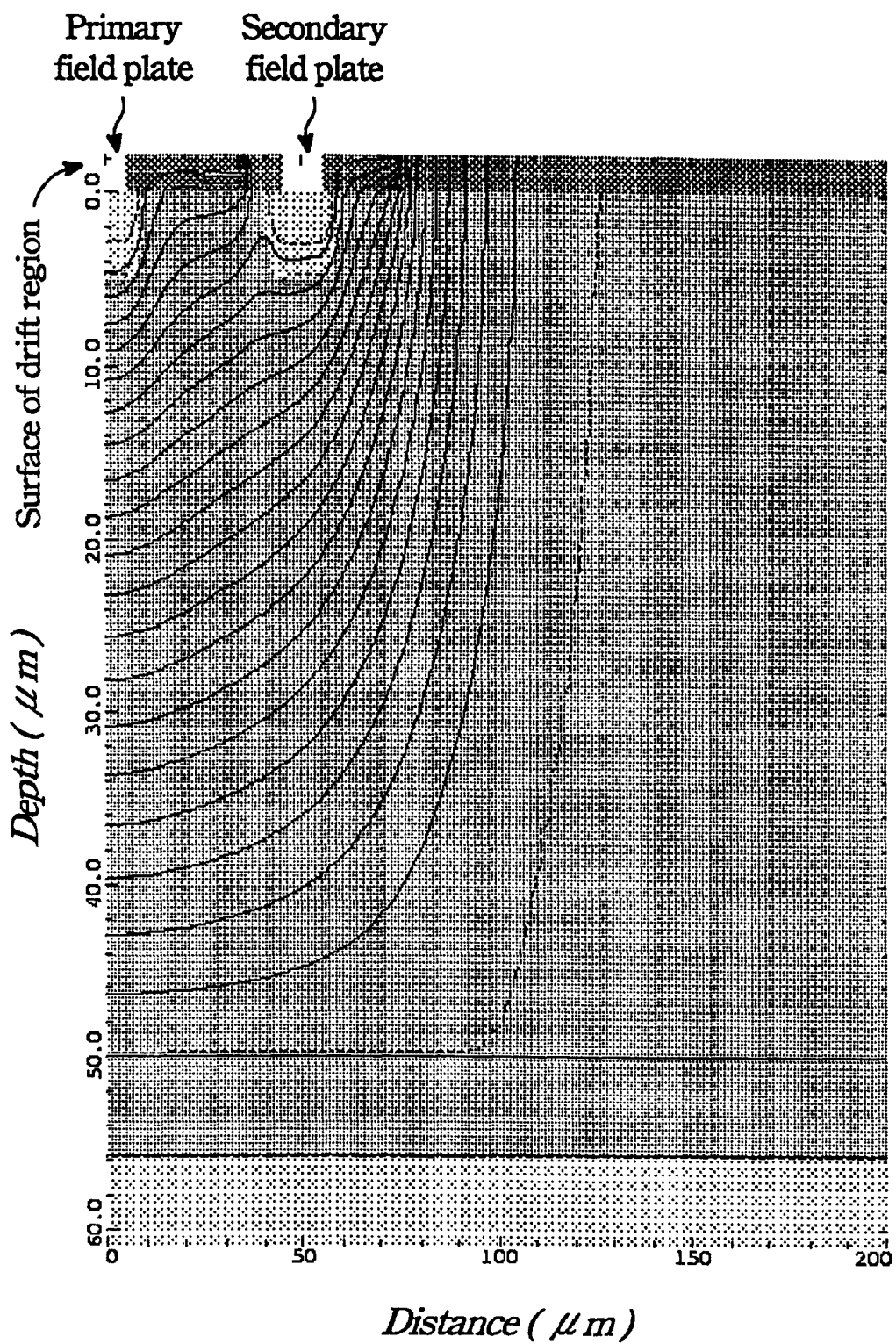
FIG. 7C shows potential contours of depth distance vs. termination surface distance for a termination structure in accordance with the present invention.
Figure 7D:
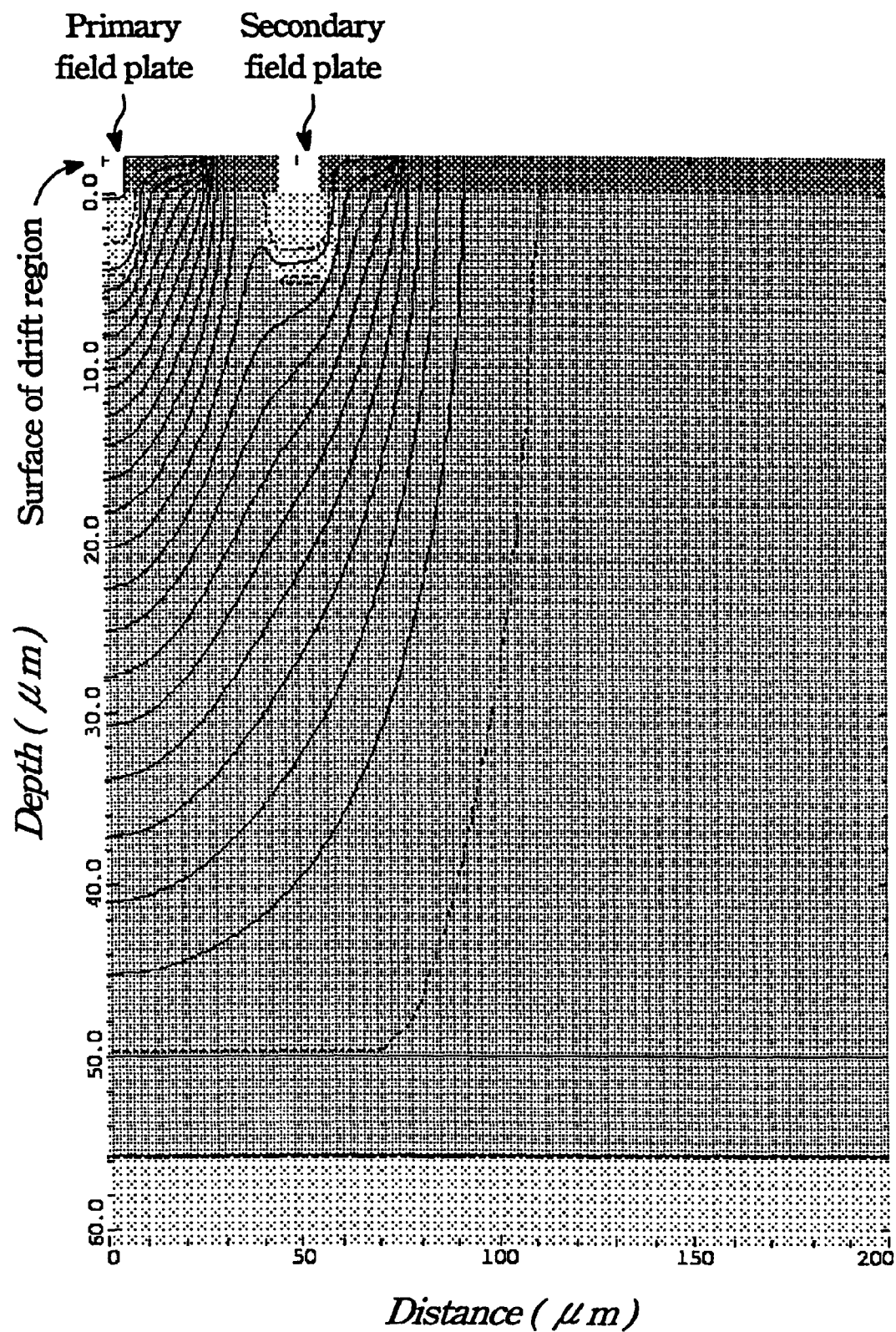
FIG. 7D shows potential contours of depth distance vs. termination surface distance for a termination structure in accordance with the prior art.

The potential contours of depth distance vs. termination surface distance in accordance with present invention and prior art are, respectively, shown in FIG. 7C and 7D when voltages of about 730V(for FIG.7C) and 598V(for FIG. 7D) are applied to the power devices. The simulation results illustrates the occurrence of electric crowding from a region near the main junction (FIG.7D) moves to away form it (FIG.7C) for 20 µm in length of the floating plate 120 when compared the potential contours of a termination structure with a floating plate to a termination structure withouta floating plate. FIG. 7E and FIG. 7F provide a comparison of surface potential of the present invention with the prior art.

The benefits of this invention are:
(1) The termination length (or say "termination area") can be significantly reduced for the same breakdown voltage obtained.
(2) The processes are compatible with the IGBT power device.

As is understood by a person skilled in the art, the foregoing preferred embodiment of the present o invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A power device termination structure, comprising:
   a semiconductor substrate having a first layer of first conductivity type therein extending to a surface thereof;
   a main junction region of second conductivity type formed in said first layer extending to a surface thereof;
   a first doping region of second conductivity type formed in said first layer extending to a surface thereof and forming a P-N junction therewith;
   an insulating region on a surface of said first layer having two windows, respectively, on said first doping region and on said main junction region;
   a primary field plate formed on said main junction region through one of said windows and having a first extension portion on said insulating region extending a distance toward said first doping region;
   a secondary field plate formed on said first doping region through the other one of said windows and having a first extension portion on said insulating region extending toward said primary field plate and a second extension portion on said insulating region extending away from said primary field plate; and
   a floating conductive plate buried in said insulating region wherein said floating conductive plate is located in between said windows capacitively coupled to said primary field plate and said secondary field plate.

2. The termination structure of claim 1, wherein said insulating region includes an thermal grown insulating layer for supporting said floating conductive plate and an deposited oxide layer for supporting said primary field plate and said secondary field plate.

3. The termination structure of claim 1, wherein said floating conductive plate has two ends, respectively, in alignment with an adjacent end of first extension portion of said primary field plate and an adjacent end of first extension portion of said secondary field plate.

4. The termination structure of claim 1, wherein said floating conductive plate has two ends, respectively, overlapping with an adjacent end of said primary field plate and an adjacent end of said secondary extension portion of said secondary field plate.

5. The power semiconductor device of claim 1, wherein said first extension portion is shorter in length than said second extension portion for said secondary field plate.

6. The power semiconductor device of claim 1, wherein said floating conductive plate having a length about the same as said first extension portion of said secondary field plate.

7. A power device termination structure, comprising:
   a semiconductor substrate having a first layer of first conductivity type therein extending to a surface thereof;
   a main junction region of second conductivity type formed in said first layer extending to a surface thereof;
   a first doping region of second conductivity type formed in said first layer extending to a surface thereof and forming a P-N junction therewith;
   a thermal oxide layer on a surface of said first layer having two windows, respectively, on said main junction region and said first doping region; only one floating conductive plate formed on said thermal oxide layer wherein said floating conductive plate is located in between said windows;
   a dielectric layer formed on said floating conductive plate and enclosed outer surface of said thermal oxide layer;
   a primary field plate formed on said main junction region through one of said windows and having a first extension portion on said dielectric layer toward said floating conductive plate;
   a secondary field plate formed on said first doping region through the other one of said windows and having a first extension portion on said dielectric region extending toward said floating conductive plate and a second extension portion on said dielectric region extending away from said floating conductive plate; and
   said floating conductive plate having two ends, respectively, in alignment with an end of said first extension portion of said primary field plate and an end of said first extension portion of said secondary field plate so that said floating conductive plate capacitively coupled to said primary field plate and said secondary field plate.

8. The termination structure of claim 7, wherein said first extension portion is shorter in length than said second extension portion for said secondary field plate.

9. The termination structure of claim 7, wherein said floating conductive plate having a length about the same as said first extension portion of said secondary field plate.

* * * * *